United States Patent
Fukusumi et al.

(10) Patent No.: US 10,741,421 B2
(45) Date of Patent: Aug. 11, 2020

(54) SEMICONDUCTOR MANUFACTURING APPARATUS

(71) Applicant: Toshiba Memory Corporation, Minato-ku (JP)

(72) Inventors: Takanori Fukusumi, Kuwana (JP); Yukinobu Miyamoto, Yokkaichi (JP)

(73) Assignee: Toshiba Memory Corporation, Manto-ku (JP)

( * ) Notice: Subject to any disclaimer, the term of this patent is extended or adjusted under 35 U.S.C. 154(b) by 256 days.

(21) Appl. No.: 15/901,094

(22) Filed: Feb. 21, 2018

(65) Prior Publication Data
US 2019/0074200 A1 Mar. 7, 2019

(30) Foreign Application Priority Data
Sep. 5, 2017 (JP) ................. 2017-170618

(51) Int. Cl.
*H01L 21/67* (2006.01)
*F27D 19/00* (2006.01)
*G05D 23/19* (2006.01)
*F27D 17/00* (2006.01)

(52) U.S. Cl.
CPC ...... *H01L 21/67017* (2013.01); *F27D 17/001* (2013.01); *F27D 19/00* (2013.01); *G05D 23/19* (2013.01); *H01L 21/67103* (2013.01); *H01L 21/67259* (2013.01); *F27D 2019/0071* (2013.01)

(58) Field of Classification Search
CPC ......... H01L 21/67017; H01L 21/67103; H01L 21/67259; F27D 17/001; F27D 19/00; F27D 2019/0071; G05D 23/19
USPC .................................................. 34/78
See application file for complete search history.

(56) References Cited

U.S. PATENT DOCUMENTS

| | | | | |
|---|---|---|---|---|
| 4,875,989 A * | 10/1989 | Davis | ..................... | G03F 7/168 204/298.33 |
| 5,303,482 A * | 4/1994 | Yamashita | ........ | H01L 21/67769 34/218 |
| 5,940,985 A * | 8/1999 | Kamikawa | ........ | H01L 21/67034 34/471 |
| 6,920,703 B2 * | 7/2005 | Taktsu | ..................... | G03F 7/40 134/902 |
| 7,065,898 B2 * | 6/2006 | Kim | .................. | H01L 21/67017 34/78 |
| 7,654,010 B2 * | 2/2010 | Moriya | ............. | H01L 21/67017 118/65 |
| 7,980,003 B2 | 7/2011 | Aoki et al. | | |

(Continued)

FOREIGN PATENT DOCUMENTS

| JP | 2004119523 A | * 4/2004 | ....... C23C 16/45563 |
|---|---|---|---|
| JP | 2007-201037 | 8/2007 | |

(Continued)

*Primary Examiner* — Stephen M Gravini
(74) *Attorney, Agent, or Firm* — Oblon, McClelland, Maier & Neustadt, L.L.P.

(57) ABSTRACT

According to an embodiment, a semiconductor manufacturing apparatus includes a holder configured to hold a processing object, a heater provided at the holder and configured to heat the processing object, a first exhaust port provided above the holder and facing the holder, and an exhaust duct. The exhaust duct is provided on an outer side surface of the first exhaust port and includes an extension and contraction function.

16 Claims, 5 Drawing Sheets

(56) References Cited

U.S. PATENT DOCUMENTS

| | | | |
|---|---|---|---|
| 7,992,318 B2* | 8/2011 | Kawaji | H01L 21/67109 |
| | | | 118/58 |
| 8,640,359 B2* | 2/2014 | Aihara | H01L 21/02041 |
| | | | 34/341 |
| 8,701,308 B2* | 4/2014 | Hiroshiro | H05B 3/0052 |
| | | | 118/723 E |
| 8,782,918 B2* | 7/2014 | Aoki | H01L 21/67109 |
| | | | 134/10 |
| 9,171,745 B2 | 10/2015 | Suzuki et al. | |
| 9,275,847 B2* | 3/2016 | Jung | H01L 21/00 |
| 9,453,614 B2* | 9/2016 | Smith | F17D 3/16 |
| 10,109,506 B2* | 10/2018 | Kim | H01L 21/67017 |
| 10,504,718 B2* | 12/2019 | Ohno | H01L 21/02101 |
| 2004/0226582 A1* | 11/2004 | Satoshi | H01L 21/67051 |
| | | | 134/25.4 |
| 2019/0074200 A1* | 3/2019 | Fukusumi | H01L 21/67017 |

FOREIGN PATENT DOCUMENTS

| | | | | |
|---|---|---|---|---|
| JP | 2011-44553 | | 3/2011 | |
| JP | 2019047042 A | * | 3/2019 | F27D 19/00 |
| WO | WO-2004030066 A1 | * | 4/2004 | H01L 21/67017 |
| WO | WO 2011/135731 A1 | | 11/2011 | |

\* cited by examiner

SEMICONDUCTOR MANUFACTURING APPARATUS

CROSS-REFERENCE TO RELATED APPLICATIONS

This application is based upon and claims the benefit of priority from Japanese Patent Application No. 2017-170018, filed on Sep. 5, 2017; the entire contents of which are incorporated herein by reference.

FIELD

Embodiments described herein relate generally to a semiconductor manufacturing apparatus.

BACKGROUND

In lithography processes, a resist is applied onto a processing object, and, thereafter, a heating process is performed which is for the purpose of removing the solvent in the resist, completing the photosensitive reaction of the resist after light exposure, or reducing the standing wave effect.

However, in the heating process, if dust is present on a holder that holds the processing object while heating the object, there is a risk that temperature unevenness or conveyance error would be caused. Accordingly, it is required to reduce dust on the holder.

DETAILED DESCRIPTION

In general, according to one embodiment, a semiconductor manufacturing apparatus includes a holder configured to hold a processing object, a heater provided at the holder and configured to heat the processing object, a first exhaust port provided above the holder and facing the holder, and an exhaust duct. The exhaust duct is provided on an outer side surface of the first exhaust port and includes an extension and contraction function.

Exemplary embodiments of a semiconductor manufacturing apparatus will be explained below in detail with reference to the accompanying drawings. The present invention is not limited to the following embodiments.

First Embodiment

Figure 1A:
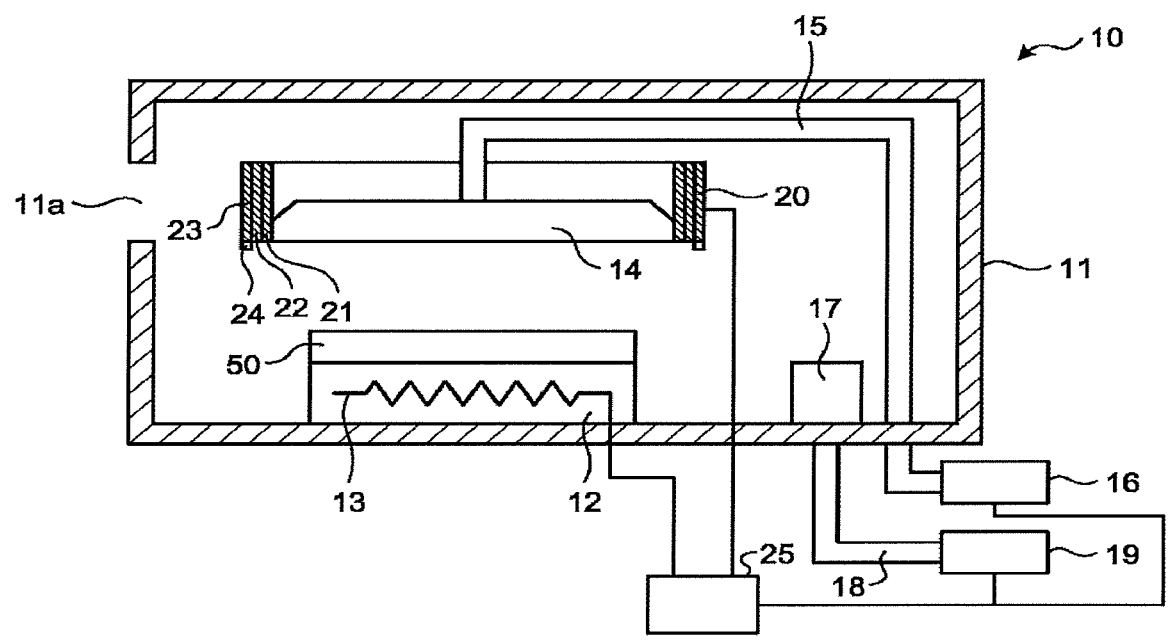
FIGS. 1A and 1B are diagrams schematically illustrating a configuration example of a semiconductor manufacturing apparatus according to a first embodiment.

FIGS. 1A and 12 are diagrams schematically illustrating a configuration example of a semiconductor manufacturing apparatus according to a first embodiment. FIG. 1A is a diagram schematically illustrating a state during a heating process to a processing object. FIG. 12 is a diagram schematically illustrating a state during a dust exhaust process. Here, in FIGS. 1F and 1B, only the components in a chamber are illustrated by a sectional view. The semiconductor manufacturing apparatus 10 includes a chamber 11 for performing a heating process to a processing object 50 with a resist applied thereon. The chamber 11 includes an opening 11a formed thereon. The opening 11a is provided to load and unload the processing object 50 into and from the chamber 11, and to introduce air from outside the chamber 11 during the heating process.

The chamber 11 is provided with a holder 12 arranged therein on the lower side to hold the processing object 50. The processing object 50 is a semiconductor substrate with a resist applied thereon, for example. A conductive film, semiconductor film, or insulating film may be provided between the semiconductor substrate and the resist. The holder 12 includes a heater 13 built therein to heat the processing object 50.

The chamber 11 is provided with a first exhaust port 14 arranged therein at a position facing the holder 12. When seen in a plan view, the holder 12 is hidden behind the first exhaust port 14. Accordingly, the first exhaust port 14 has a size larger than the contour of the holder 12, and the first exhaust port 14 is arranged to cover the holder 12 as a whole. The first exhaust port 14 is formed of a hood, for example. The first exhaust port 14 is connected to a first exhaust unit 16 such as a vacuum pump through a piping line 15. The first exhaust port 14 is mainly used to remove dust present on the holder 12.

The chamber 11 is provided with a second exhaust port 17 arranged therein near the holder 12 on the lower side. The second exhaust port 17 is connected to a second exhaust unit 19 such as a vacuum pump through a piping line 18. The second exhaust port 17 is mainly used to exhaust gas from inside the chamber 11 during the heating process performed to the processing object 50. As illustrated in FIGS. 1A and 1D, the first exhaust unit 16 and the second exhaust unit 19 are individually provided; however, a single exhaust unit may be connected to the first exhaust port 14 and the second exhaust port 17 through the respective piping lines 15 and 18.

Figure 1B:
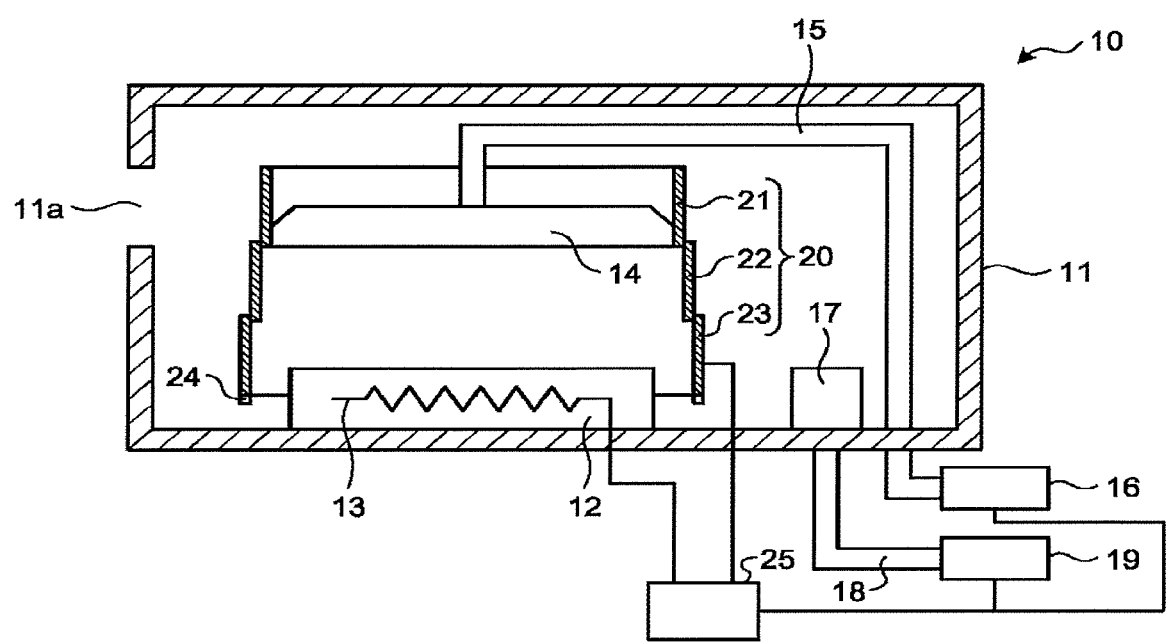

The outer side surface of the first exhaust port 14 is equipped with an extendable exhaust duct 20 that covers the outer side surface of the first exhaust port 14. During the heating process to the processing object 50, as illustrated in FIG. 1A, the exhaust duct 20 is folded, and is held on the outer side surface of the first exhaust port 14. During the dust exhaust process, as illustrated in FIG. 1B, the exhaust duct 20 is extended such that its distal end reaches near the holder 12. The exhaust duct 23 has an extendable configuration, such as a telescopic structure or bellows structure. Further, the exhaust duct 20 is made of a material that is not thermally deformed by heating of the heater 13 during the dust exhaust process.

In the example of FIGS. 1A and 12, the exhaust duct 20 has a telescopic structure. Here, the exhaust duct 20 includes a first cylindrical portion 21, a second cylindrical portion 22, and a third cylindrical portion 23, in this order from the inner side. The outer side surface of the first exhaust port 14 is in contact with the inner wall of the first cylindrical portion 21 over the whole circumference. As illustrated in FIG. 1A, the third cylindrical portion 23 receives the second cylindrical portion 22 inside, and the second cylindrical portion 22 receives the first cylindrical portion 21 inside, so that a contracted state is formed. Further, as illustrated in FIG. 1B, the second cylindrical portion 22 is pulled down from the first cylindrical portion 21, and the third cylindrical portion 23 is pulled down from the second cylindrical portion 22, so that an extended state is formed.

Here, the axial center of the first cylindrical portion 21, the second cylindrical portion 22, and the third cylindrical portion 23 almost agrees with the axial center of the first exhaust port 14. Further, between the first cylindrical portion 21 and the second cylindrical portion 22, the following two stoppers (not illustrated) are provided: One stopper prevents the second cylindrical portion 22 from being pulled down by a predetermined length or more when the second cylindrical portion 22 is pulled down from the first cylindrical portion 21. The other stopper prevents the first cylindrical portion 21 from being put into the second cylindrical portion 22 by a predetermined length or more when the first cylindrical portion 21 is put into the second cylindrical portion 22. Further, between the second cylindrical portion 22 and the third cylindrical portion 23, the following two stoppers (not illustrated) are provided: One stopper prevents the third cylindrical portion 23 from being pulled down by a predetermined length or more when the third cylindrical portion 23 is pulled down from the second cylindrical portion 22. The other stopper prevents the second cylindrical portion 22 from being put into the third cylindrical portion 23 by a predetermined length or more when the second cylindrical portion 22 is put into the third cylindrical portion 23.

Here, although not illustrated, a drive unit is connected to the exhaust duct 20, and is configured to perform pull-out and put-in of the first cylindrical portion 21, the second cylindrical portion 22, and the third cylindrical portion 23. Further, a case is illustrated here where the exhaust duct 20 is composed of three cylindrical portions; however, the number of cylindrical portions is not limited, as long as the exhaust duct 20 is composed of two or more cylindrical portions.

Third cylindrical portion is equipped with a position sensor 24 at a predetermined position on its lower distal end. The position sensor 24 measures the distance from the bottom surface of the chamber 11, for example. As the position sensor 24, for example, a laser displacement meter or the like may be used which includes a laser output part that emits laser light, and a reception part that receives a reflected laser light that the laser light emitted from the laser output part is reflected from, for example, the bottom surface of the chamber 11.

The semiconductor manufacturing apparatus 10 includes a controller 25 that controls operations of the semiconductor manufacturing apparatus 10. The controller 25 controls operations of the heater 13, the first exhaust unit 16, the second exhaust unit 19, and the drive unit for driving the exhaust duct 20. Further, in accordance with position information from the position sensor 24, the controller 25 controls an operation of the drive unit to set the position of the lower distal end of the exhaust duct 20 to a predetermined position.

Next, an explanation will be given of an operation of the semiconductor manufacturing apparatus 10 configured as described above. In the process of manufacturing a semiconductor device, a resist is applied onto a processing object 50, and is subjected to a light exposure process and a development process, so that a resist pattern is formed. Here, in general, a heating process is often performed to the processing object 50, (A) after the resist application, (F) after the light exposure, and (C) after the development. The heating process after the resist application is performed to remove the solvent in the resist and to uniformly disperse resist molecules to stabilize the resist. The heating process after the light exposure is performed to diffuse portions having sensed light to finish the pattern into a smoother shape, because portions exposed to light are not uniform in the resist after the light exposure. The heating process after the development is performed to improve the adhesiveness of the resist, and to remove the solvent or developing solution remaining in the resist.

Incidentally, when a heating process is performed to the processing object 50, if dust is present on the holder 12 of the semiconductor manufacturing apparatus 10, there may be a case where temperature unevenness is generated, the backside of the processing object 50 is contaminated, and/or dust comes onto the processing object 50. As a result, there is a risk that baking could not be performed well to the resist. In consideration of these problems, the dust exhaust process is performed before the heating process, to move dust on the holder 12 as far as possible.

As illustrated in FIG. 1B, under a state where the processing object 50 is not placed on the holder 12, the exhaust duct 20 is extended such that the distal end of the exhaust duct 20 is positioned near the holder 12. As illustrated in FIG. 1B, the position of the distal end of the exhaust duct 20 may be set lower than the upper surface of the holder 12, or may be set to a predetermined height from the upper surface of the holder 12. Namely, the position of the distal end of the exhaust duct 20 may be set so that height of the first exhaust port from the bottom surface of the chamber 11 is a predetermined height. Thereafter, gas exhaust is performed by the first exhaust unit 16. When the exhaust is performed in a space covered by the exhaust duct 20, uniform flows are generated from the upper surface of the holder 12 toward the first exhaust port 14, and dust on the holder 12 is sucked up. The dust is exhausted through the exhaust duct 20, the first exhaust port 14, and the piping line 15. After the exhaust is performed for a predetermined time, the exhaust by the first exhaust unit 16 is stopped, and the exhaust duct 20 is contracted.

Thereafter, as illustrated in FIG. 1A, the exhaust duct 20 is contracted onto the side surface of the first exhaust port 14. Then, the processing object 50 is loaded into the chamber 11 through the opening 11a, and is placed onto the holder 12. Then, gas exhaust is performed by the first exhaust unit 16 and the second exhaust unit 19. Further, the processing object 50 is heated by the heater 13 to a predetermined temperature. During the heating process to the processing object 50, the solvent or sublimate derived from the resist is exhausted from the first exhaust port 14 and the second exhaust port 17. After the heating process is performed for a predetermined time, the heating by the heater 13 is stopped, and the exhaust by the first exhaust unit 16 and the second exhaust unit 19 is also stopped.

Figure 2:
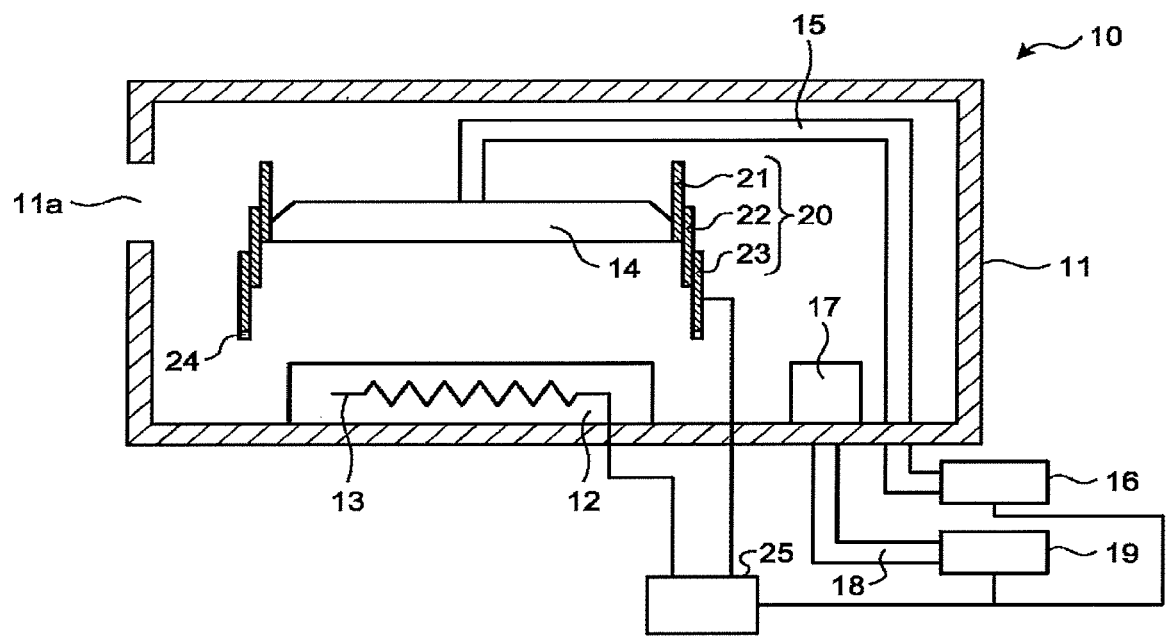
FIG. 2 is a diagram schematically illustrating another configuration example f a semiconductor manufacturing apparatus cording to the first embodiment.

FIG. 2 is a diagram schematically illustrating another configuration example of a semiconductor manufacturing apparatus according to the first embodiment. Here, in FIG. 2, only the components in the chamber 11 are illustrated by a sectional view. In the case of FIG. 1B, during the dust exhaust process, the distal end of the exhaust duct 20 is set lowered to a position lower than the upper surface of the holder 12. However, as long as a desired dust removal capability is obtained, the position of the distal end of the exhaust duct 20 is not limited to this example. For example, as illustrated in FIG. 2, the distal end of the exhaust duct 20 may be set to a position above the upper surface of the holder 12. In this case, on the basis of the position of the distal end of the exhaust duct 20 obtained by the position sensor 24, the controller 25 controls the drive unit for driving the operation of the exhaust duct 20 such that the position of the distal end of the exhaust duct 20 is set to a predetermined height.

In the first embodiment, during the dust exhaust process, the exhaust duct 20 is arranged to cover the space between the first exhaust port 14 and the holder 12 from the side surface, and gas is exhausted from the first exhaust port 14. Consequently, a space smaller than the space inside the chamber 11 is formed by the space covered by the exhaust duct 20, and uniform flows are created therein upward from below to suck up dust on the holder 12. As a result, it is possible to reduce dust on the holder 12, and thereby to alleviate temperature unevenness of the processing object 50 placed on the holder 12 when the heating process is performed.

Second Embodiment

Figure 3A:
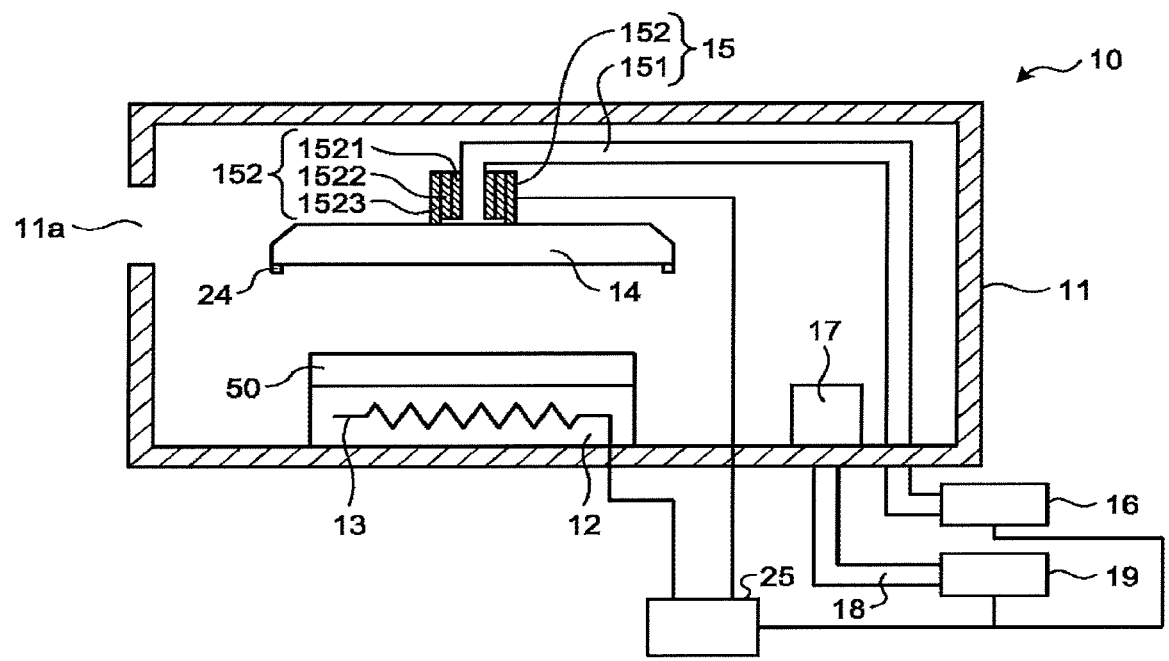
FIGS. 3A and 3B are diagrams schematically illustrating a configuration example of a semiconductor manufacturing apparatus according to a second embodiment.
Figure 3B:
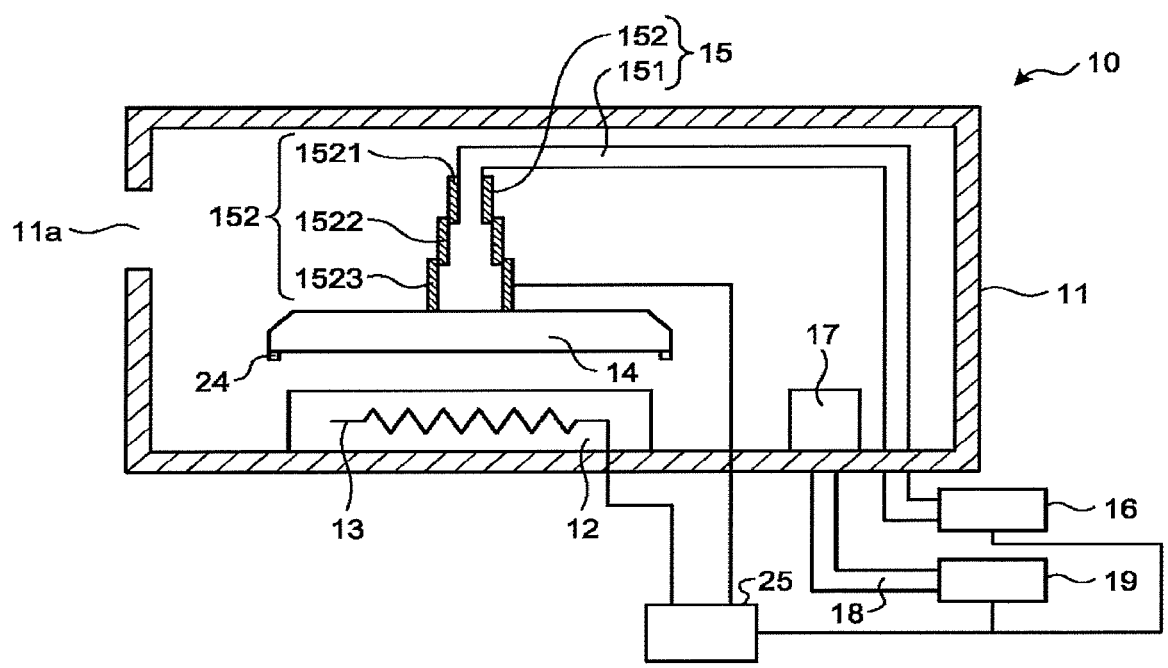

FIGS. 3A and 3B are diagrams schematically illustrating a configuration example of a semiconductor manufacturing apparatus according to a second embodiment. FIG. 3A is a diagram schematically illustrating a state during a heating process a processing object. FIG. 35 is a diagram schematically illustrating a state during a dust exhaust process. Here, in FIGS. 3A and 35, only the components in the chamber 11 are illustrated by a sectional view.

In the second embodiment, the first exhaust port 14 is configured to be movable in the vertical direction. Specifically, there is no exhaust duct 20 on the outer side surface of the first exhaust port 14. Instead, there is a piping line 15 that is composed of a stationary-type piping member 151 and a piping member 152 including an extension and contraction mechanism. The piping member 152 including the extension and contraction mechanism is arranged between the first exhaust port 14 and the stationary-type piping member 151. The piping member 152 including the extension and contraction mechanism has an extendable configuration, such as a telescopic structure or bellows structure. Further, the piping member 152 including the extension and contraction mechanism is made of a material that is not thermally deformed by heating of the heater 13 during the dust exhaust process.

In the example of FIGS. 3A and 3B, the piping member 152 including the extension and contraction mechanism has the telescopic structure. Here, the piping member 152 including the extension and contraction mechanism includes a first cylindrical portion 1521, a second cylindrical portion 1522, and a third cylindrical portion 1523, in this order from the inner side. The outer side surface near the distal end of the stationary-type piping member 151 is in contact with part of the inner wall of the first cylindrical portion 1521 over the whole circumference. Further, the lower distal end of the third cylindrical portion 1523 is fixed to the first exhaust port 14. As illustrated in FIG. 3A, the third cylindrical portion 1523 receives the second cylindrical portion 1522 inside, and the second cylindrical portion 1522 receives the first cylindrical portion 1521 inside, so that a contracted state is formed. Further, as illustrated in FIG. 3B, the second cylindrical portion 1522 is pulled down from the first cylindrical portion 1521, and the third cylindrical portion 1523 is pulled down from the second cylindrical portion 1522, so that an extended state is formed.

Here, the axial center of the first cylindrical portion 1521, the second cylindrical portion 1522, and the third cylindrical portion 1523 almost agrees with the axial center of the exhaust port 14. Further, between the first cylindrical portion 1521 and the second cylindrical portion 1522, the following two stoppers (not illustrated) are provided: One stopper prevents the second cylindrical portion 1522 from being pulled down by a predetermined length or more when the second cylindrical portion 1522 is pulled down from the first cylindrical portion 1521. The other stopper prevents the first cylindrical portion 1521 from being put into the second cylindrical portion 1522 by a predetermined length or more when the first cylindrical portion 1521 is put into the second cylindrical portion 1522. Further, between the second cylindrical portion 1522 and the third cylindrical portion 1523, the following two stoppers (not illustrated) are provided: One stopper prevents the third cylindrical portion 1523 from being pulled down by a predetermined length or more when the third cylindrical portion 1523 is pulled down from the second cylindrical portion 1522. The other stopper prevent: the second cylindrical portion 1522 from being put into the third cylindrical portion 1523 by a predetermined length or more when the second cylindrical portion 1522 is put into the third cylindrical portion 1523.

Here, although not illustrated, a drive unit is connected to the piping member 152 including the extension and contraction mechanism, and is configured to perform pull-out and put-in of the first cylindrical portion 1521, the second cylindrical portion 1522, and the third cylindrical portion 1523. Further, a case is illustrated here where the piping member 152 including the extension and contraction mechanism is composed of three cylindrical portions; however, the number of cylindrical portions is not limited, as long as the piping member 152 including the extension and contraction mechanism is composed of two or more cylindrical portions.

Further, the first exhaust port 14 is equipped with the position sensor 24 at a predetermined position on its lower distal end. Here, the constituent elements corresponding to those of the semiconductor manufacturing apparatus 10 according to the first embodiment are denoted by the same reference symbols, and their description is omitted.

Next, an explanation will be given of an operation of the semiconductor manufacturing apparatus 10 configured as described above. During the dust exhaust process, as illustrated in FIG. 3B, under a state where the processing object 50 is not placed on the holder 12, the piping member 152 including the extension and contraction mechanism is extended such that the distal end of the first exhaust port 14 is positioned near the holder 12. As illustrated in FIG. 3B, the position of the distal end of the first exhaust port 14 is set to a position where it is possible to remove dust from the upper surface of the holder 12 during the dust exhaust process. Thereafter, gas exhaust is performed by the first exhaust unit 16. When the exhaust is performed in a state where the first exhaust port 14 is placed adjacent to the upper surface of the holder 12, uniform flows are generated from the upper surface of the holder 12 toward the first exhaust port 14, and dust on the holder 12 is sucked up. The dust is exhausted through the first exhaust port 14 and the piping line 15. After the exhaust is performed for a predetermined time, the exhaust by the first exhaust unit 16 is stopped, Thereafter, as illustrated in FIG. 3A, the piping member 152 including an extension mechanism is contracted. Then, the processing object 50 is loaded into the chamber 11 through the opening 11a, and is placed onto the holder 12. Then, gas exhaust is performed by the first exhaust unit 16 and the second exhaust unit 19. Further, the processing object 50 is heated by the heater 13 to a predetermined temperature. During the heating process the processing object 50, the solvent or sublimate derived from the resist is exhausted from the first exhaust port 14 and the second exhaust port 17. After the heating process is performed for a predetermined time, the heating by the heater 13 is stopped, and the exhaust by the first exhaust unit 16 and the second exhaust unit 19 is also stopped.

In the second embodiment, the first exhaust port 14 arranged to the face the holder 12 is configured to be movable in a direction toward the holder 12. Also in the second embodiment, an effect substantially the same as that of the first embodiment can be obtained.

Third Embodiment

Figure 4A:
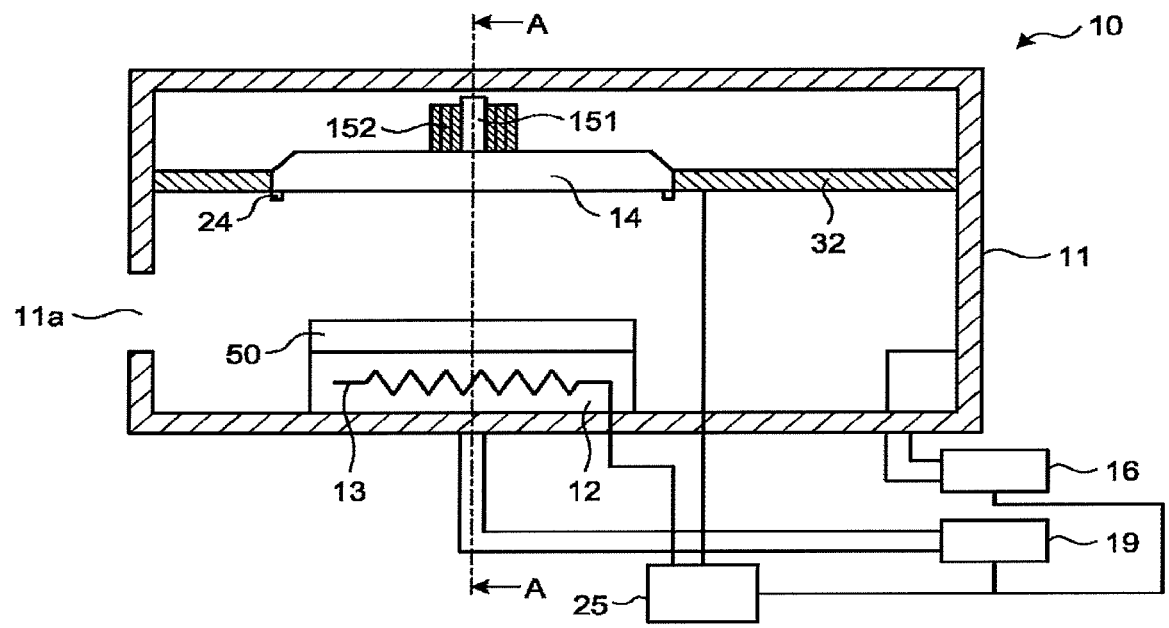
FIGS. 4A and 4B are diagrams schematically illustrating a configuration example of a semiconductor manufacturing apparatus cording to a third embodiment.
Figure 4B:
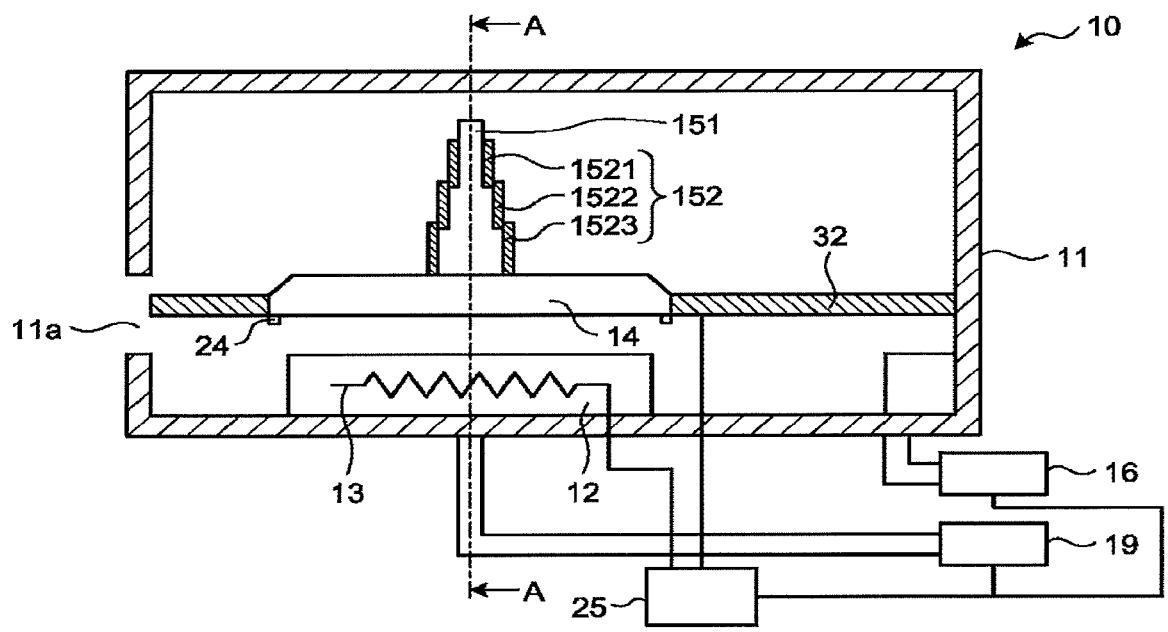
Figure 5A:
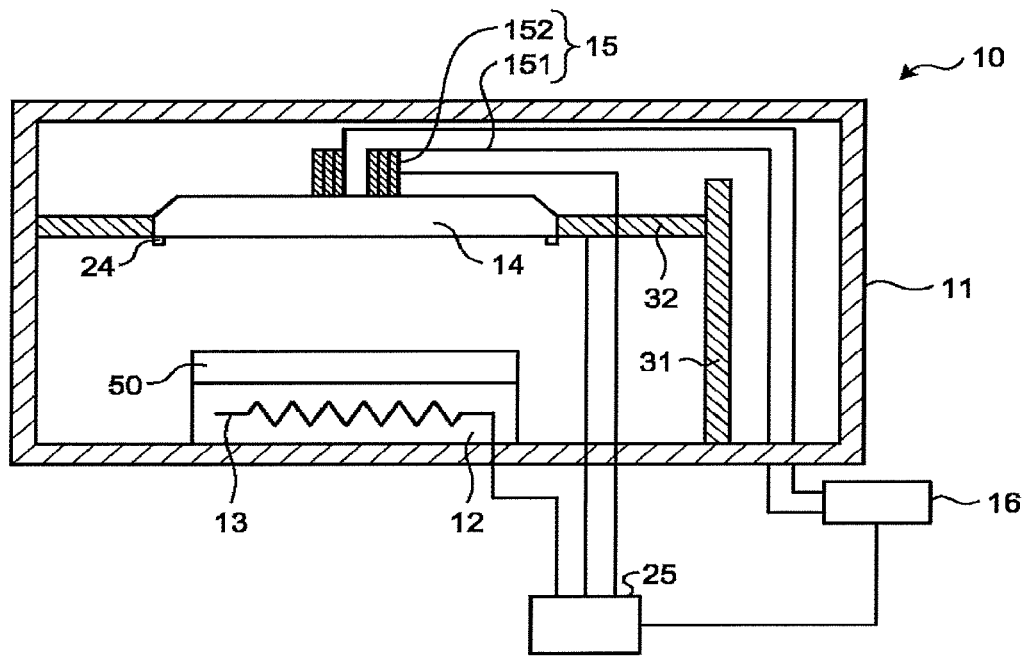
FIGS. 5A and 5B are diagrams schematically illustrating the configuration example of a semiconductor manufacturing apparatus according to the third embodiment.
Figure 5B:
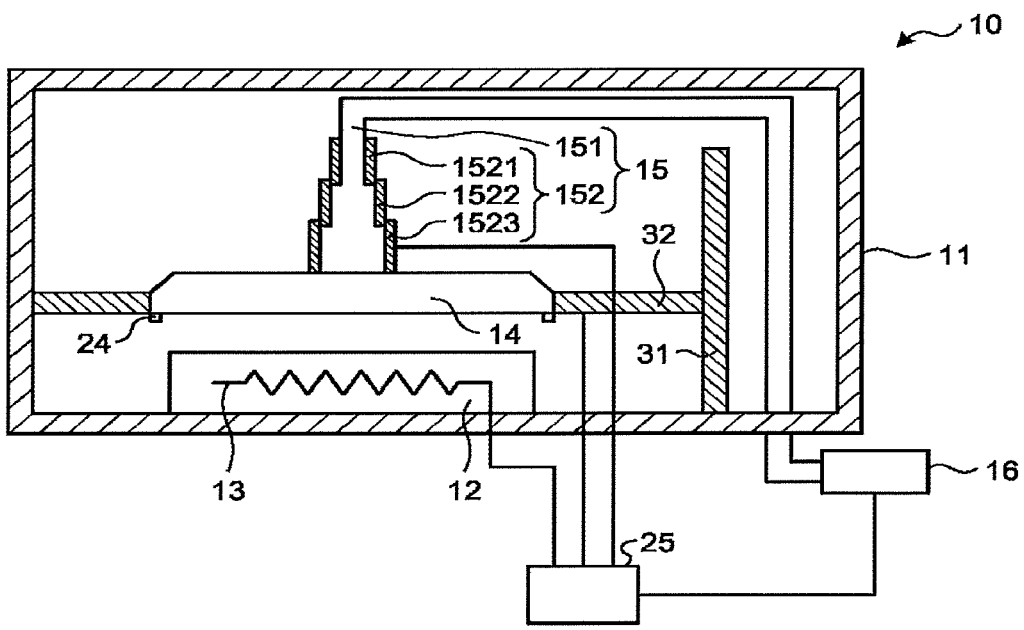

FIGS. 4A, 4B, 5A, and 5B are diagrams schematically illustrating a configuration example of a semiconductor manufacturing apparatus according to a third embodiment. FIGS. 4A and 5A are diagrams schematically illustrating a state during a heating process to a processing object. FIGS. 4B and 5B are diagrams schematically illustrating a state during a dust exhaust process. Here, FIGS. 5A and 5B are sectional views taken along a line A-A of FIGS. 4A and 4B, respectively. Further, in FIGS. 4A to 5B, only the components in the chamber 11 are illustrated by a sectional view.

In the third embodiment, the semiconductor manufacturing apparatus 10 includes a first partition wall (plate) 31 that partitions a space containing the holder 12 inside the chamber 11, and a second partition wall (plate) 32 provided on the upper side of a space surrounded by the first partition wall 31 and the sidewall of the chamber 11 to contain the holder 12. The first exhaust port 14 is fixed to the second partition wall 32 in an embedded state. Further, the second partition wall 32 is provided with a drive unit (not illustrated) for moving the second partition wall 32 in the height direction. Specifically, the first exhaust port 14 can be moved in the height direction in accordance with movement of the second partition wall 32.

The first exhaust port 14 is connected to a piping line 15. The piping line 15 has a configuration substantially the same as that of the second embodiment. Specifically, the piping line 15 is composed of a stationary-type piping member 151 and a piping member 152 including the extension and contraction mechanism. The piping member 152 including the extension and contraction mechanism is arranged between the first exhaust port 14 and the stationary-type piping member 151. The piping member 152 including the extension and contraction mechanism has an extendable configuration, such as a telescopic structure or bellows structure. Further, the piping member 152 including the extension and contraction mechanism is made of a material that is not thermally deformed by heating of the heater 13 during the dust exhaust process. A drive unit (not illustrated) is connected to the piping member 152 including the extension and contraction mechanism, and is configured to perform pull-out and put-in of a first cylindrical portion 1521, a second cylindrical portion 1522, and a third cylindrical portion 1523. Here, the constituent elements corresponding to those of the first and second embodiments are denoted by the same reference symbols, and their description is omitted.

Basically, the semiconductor manufacturing apparatus 10 configured as described above is operated in a way substantially the same as that of the second embodiment. During the dust exhaust process, as illustrated in FIGS. 45 and 55, the piping member 152 including an extension mechanism is extended such that the second partition wall 32 is lowered to a first height relative to the upper surface of the holder 12, and gas exhaust is performed by the first exhaust unit 16. On the other hand, during the heating process to the processing object 50, as illustrated in FIGS. 4A and 5A, the piping member 152 including an extension mechanism is contracted such that the second partition wall 32 is set in a lifted state with a second height higher than the first height relative to the upper surface of the holder 12. In this state, gas exhaust is performed by the first exhaust unit 16 and the second exhaust unit 19. Further, the processing object 50 is heated by the heater 13 to a predetermined temperature.

Also in the third embodiment, an effect substantially the same as that of the second embodiment can be obtained.

In the above-described embodiments, the first exhaust port 14 is moved in the vertical direction, however at least one of the first exhaust port 14 and the holder 12 may be moved so that a distance between the first exhaust port 14 and the holder 12 is extended or contracted.

What is claimed is:

1. A semiconductor manufacturing apparatus comprising:
   a holder configured to hold a processing object;
   a heater provided at the holder and configured to heat the processing object;
   a first exhaust port provided above the holder and facing the holder;
   an exhaust duct provided on an outer peripheral surface of the first exhaust port, the exhaust duct being extendable toward and contractible away from the holder; and
   a first exhaust unit connected to the first exhaust port,
   wherein the exhaust duct includes a telescopic structure or bellows structure,
   wherein the exhaust duct includes a first cylindrical portion, a second cylindrical portion, and a third cylindrical portion,
   wherein an inner peripheral surface of the first cylindrical portion is in contact with an outer peripheral surface of the first exhaust port,
   wherein an inner peripheral surface of the second cylindrical portion is slidable along an outer peripheral surface of the first cylindrical portion,
   wherein an inner peripheral surface of the third cylindrical portion is slidable along an outer peripheral surface of the second cylindrical portion,
   wherein under a state where the processing object is not placed on the holder, the exhaust duct is extended toward the holder such that:
   (i) the second cylindrical portion is supported by the first cylindrical portion with an upper end part of the second cylindrical portion being received by a lower end part of the first cylindrical portion, and
   (ii) the third cylindrical portion is supported by the second cylindrical portion with an upper end part of the third cylindrical portion being received by a lower end part of the second cylindrical portion so that a lower end part of the third cylindrical portion is located below an upper surface of the holder, and
   (iii) gas is exhausted through the first exhaust port to the first exhaust unit.

2. The semiconductor manufacturing apparatus according to claim 1, further comprising:
   a second exhaust port provided near a side surface of the holder; and
   a second exhaust unit connected to the second exhaust port, wherein
   under a state where the processing object is placed on the holder, the exhaust duct is contracted, and gas is exhausted from the first exhaust port and the second exhaust port by the first exhaust unit and the second exhaust unit.

3. The semiconductor manufacturing apparatus according to claim 1, further comprising a position sensor provided on a distal end of the exhaust duct on a side closer to the holder, and configured to measure height of the distal end of the exhaust duct on the side closer to the holder, wherein
   a position of the distal end of the exhaust duct on the side closer to the holder is fixed to a predetermined position.

4. The semiconductor manufacturing apparatus according to claim 2, wherein the second exhaust unit is constituted by the first exhaust unit.

5. A semiconductor manufacturing apparatus comprising:
a chamber having an opening through which a processing object is transferrable into and out from the chamber, the opening being formed on a side wall part of the chamber, and the opening allowing air to be supplied therethrough to the chamber;
a holder configured to hold a processing object inside the chamber;
a heater provided at the holder and configured to heat the processing object;
a first exhaust port provided above the holder and facing the holder inside the chamber;
a first piping line connected to the first exhaust port;
a drive unit configured to drive at least one of the first exhaust port and the holder to extend and contract a distance between the first exhaust port and the holder; and
a first exhaust unit connected to the first piping line,
wherein the first piping line includes
   (i) a first piping member having an unchangeable length, and
   (ii) a second piping member having a first cylindrical portion, a second cylindrical portion, and a third cylindrical portion, so as to be extendable to vary the distance between the first exhaust port and the holder,
wherein an inner peripheral surface of the first cylindrical portion is in contact with an outer peripheral surface of the first exhaust port,
wherein an inner peripheral surface of the second cylindrical portion is slidable along an outer peripheral surface of the first cylindrical portion, and
wherein an inner peripheral surface of the third cylindrical portion is slidable along an outer peripheral surface of the second cylindrical portion, the third cylindrical portion having the first exhaust port attached to a lower end part thereof,
wherein under a state where the processing object is not placed on the holder, the second piping member is extended toward the holder such that:
   (i) the second cylindrical portion is supported by the first cylindrical portion with an upper end part of the second cylindrical portion being received by a lower end part of the first cylindrical portion,
   (ii) the third cylindrical portion is supported by the second cylindrical portion with an upper end part of the third cylindrical portion being received by a lower end part of the second cylindrical portion so that the first exhaust port is located at a first height that is higher than an upper surface of the holder and lower than the opening, from a bottom surface of the chamber, and
   (iii) gas is exhausted through the first exhaust port to the first exhaust unit.

6. The semiconductor manufacturing apparatus according to claim 5, wherein the second piping member includes a telescopic structure or bellows structure.

7. The semiconductor manufacturing apparatus according to claim 5, further comprising:
a second exhaust port provided near a side surface of the holder; and
a second exhaust unit connected to the second exhaust port through a second piping line, wherein
under a state where the processing object is placed on the holder, the second piping member is contracted such that height of the first exhaust port from the bottom surface of the chamber becomes a second height higher than the first height, and gas is exhausted from the first exhaust port and the second exhaust port by the first exhaust unit and the second exhaust unit.

8. The semiconductor manufacturing apparatus according to claim 5, further comprising a position sensor provided on a distal end of the first exhaust port on a side closer to the holder, and configured to measure height of the distal end of the first exhaust port on the side closer to the holder, wherein
   a position of the distal end of the first exhaust port on the side closer to the holder is fixed to a predetermined position.

9. The semiconductor manufacturing apparatus according to claim 7, wherein the second exhaust unit is constituted by the first exhaust unit.

10. The semiconductor manufacturing apparatus according to claim 5, further comprising a partition plate provided inside the chamber in parallel with a bottom surface of the chamber, and holding the first exhaust port, the partition plate being movable in a height direction, wherein
   the drive unit is configured to drive the partition plate in the height direction.

11. The semiconductor manufacturing apparatus according to claim 10, further comprising a first exhaust unit connected to the first piping line, wherein
under a state where the processing object is not placed on the holder, the partition plate is set lowered toward the holder such that height of the partition plate from the bottom surface of the chamber becomes a first height, and gas is exhausted from the first exhaust port by the first exhaust unit.

12. The semiconductor manufacturing apparatus according to claim 11, further comprising:
a second exhaust port provided near a side surface of the holder; and
a second exhaust unit connected to the second exhaust port through a second piping line, wherein
under a state where the processing object is placed on the holder, the partition plate is moved such that height of the partition plate from the bottom surface of the chamber becomes a second height higher than the first height, and gas is exhausted from the first exhaust port and the second exhaust port by the first exhaust unit and the second exhaust unit.

13. The semiconductor manufacturing apparatus according to claim 10, further comprising a position sensor provided on a distal end of the first exhaust port on a side closer to the holder, and configured to measure height of the distal end of the first exhaust port on the side closer to the holder, wherein
   a position of the distal end of the first exhaust port on the side closer to the holder is fixed to a predetermined position.

14. The semiconductor manufacturing apparatus according to claim 12, wherein the second exhaust unit is constituted by the first exhaust unit.

15. The semiconductor manufacturing apparatus according to claim 10, wherein the first piping line includes a first piping member having an unchangeable length, and a second piping member extendable to vary a distance between the holder and the first exhaust port.

16. The semiconductor manufacturing apparatus according to claim 15, wherein the second piping member includes a telescopic structure or bellows structure.

* * * * *